(12) United States Patent
Ichiryu et al.

(10) Patent No.: US 7,726,545 B2
(45) Date of Patent: Jun. 1, 2010

(54) FLIP CHIP MOUNTING PROCESS AND BUMP-FORMING PROCESS USING ELECTRICALLY-CONDUCTIVE PARTICLES AS NUCLEI

(75) Inventors: Takashi Ichiryu, Osaka (JP); Seiichi Nakatani, Osaka (JP); Seiji Karashima, Osaka (JP); Yoshihiro Tomita, Osaka (JP); Koichi Hirano, Osaka (JP); Toshio Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 266 days.

(21) Appl. No.: 11/886,311

(22) PCT Filed: Mar. 13, 2006

(86) PCT No.: PCT/JP2006/304891

§ 371 (c)(1),
(2), (4) Date: Oct. 4, 2007

(87) PCT Pub. No.: WO2006/098268

PCT Pub. Date: Sep. 21, 2006

(65) Prior Publication Data
US 2008/0165518 A1 Jul. 10, 2008

(30) Foreign Application Priority Data
Mar. 16, 2005 (JP) ............................. 2005-074595

(51) Int. Cl.
  B23K 31/02 (2006.01)
  B23K 31/00 (2006.01)
  H01L 21/44 (2006.01)
(52) U.S. Cl. .............................. 228/180.22; 228/248.1; 438/613

(58) Field of Classification Search . 228/179.1–180.22, 228/245, 246, 248.1, 248.5, 254; 438/108, 438/612–614
See application file for complete search history.

(56) References Cited

U.S. PATENT DOCUMENTS 3,839,727 A * 10/1974 Herdzik et al. .............. 257/737

(Continued)

FOREIGN PATENT DOCUMENTS

EP          1 615 263        1/2006

(Continued)

OTHER PUBLICATIONS

International Search Report (in English language) issued Apr. 18, 2006 in PCT/JP2006/304891 of which the present application is the U.S. National Stage.

*Primary Examiner*—Jessica L. Ward
*Assistant Examiner*—Carlos Gamino
(74) *Attorney, Agent, or Firm*—Wenderoth, Lind & Ponack, L.L.P.

(57) ABSTRACT

A flip chip mounting process or a bump-forming process according to the present invention is characterized in that electrically-conductive particles are fixed on electrodes formed on an electronic component. A composition comprising solder powder, a convection additive and a resin component is supplied onto a surface of the electronic component, the surface is provided with the electrodes. The supplied composition is heated up to a temperature enabling the solder powder to melt. As a result, the convection additive boils or is decomposed so as to generate a gas. The generated gas produces a convection phenomenon within the supplied composition. Since the convection phenomenon promotes the movement of the solder powder, the solder powder can move freely within the composition. The electrically-conductive particles serve as nuclei for the solder powder to self-assemble and grow. As a result, the molten solder powder is allowed to self-assemble and grow in the vicinity of the electrically-conductive particles, which leads to a formation of connections or bumps.

9 Claims, 8 Drawing Sheets

U.S. PATENT DOCUMENTS

| | | | |
|---|---|---|---|
| 5,145,532 | A | 9/1992 | Fukunaga et al. |
| 5,429,293 | A * | 7/1995 | Bradley et al. ......... 228/180.22 |
| 6,070,788 | A * | 6/2000 | Zakel ..................... 228/214 |
| 6,109,507 | A * | 8/2000 | Yagi et al. ................. 427/97.2 |
| 6,149,048 | A * | 11/2000 | Brearley et al. ............... 228/33 |
| 6,189,771 | B1 * | 2/2001 | Maeda et al. ............ 228/248.1 |
| 6,225,206 | B1 * | 5/2001 | Jimarez et al. ............. 438/616 |
| 6,271,110 | B1 * | 8/2001 | Yamaguchi et al. ......... 438/613 |
| 6,276,597 | B1 * | 8/2001 | Budinger et al. ............ 228/225 |
| 6,348,401 | B1 * | 2/2002 | Chen et al. ................. 438/617 |
| 6,523,736 | B1 * | 2/2003 | Farnworth ................. 228/254 |
| 6,564,987 | B2 * | 5/2003 | Imai et al. .................. 228/103 |
| 6,609,652 | B2 * | 8/2003 | MacKay et al. ............ 228/254 |
| 6,612,027 | B2 * | 9/2003 | Akram ....................... 29/843 |
| 6,796,025 | B2 * | 9/2004 | Imamura et al. ............. 29/840 |
| 6,846,735 | B1 * | 1/2005 | Lin et al. .................... 438/613 |
| 6,849,534 | B2 * | 2/2005 | Ho et al. ..................... 438/614 |
| 6,933,221 | B1 * | 8/2005 | Jiang .......................... 438/613 |
| 7,531,387 | B1 * | 5/2009 | Karashima et al. .......... 438/127 |
| 7,537,961 | B2 * | 5/2009 | Nakatani et al. ............ 438/108 |
| 2001/0008310 | A1 | 7/2001 | Sakuyama et al. |
| 2001/0019075 | A1 | 9/2001 | Abe et al. |
| 2002/0185309 | A1 | 12/2002 | Imamura et al. |
| 2006/0108402 | A1 * | 5/2006 | Crisp et al. ............... 228/248.1 |
| 2007/0001313 | A1 * | 1/2007 | Fujimoto et al. ............. 257/778 |
| 2007/0158387 | A1 * | 7/2007 | Shirai et al. ................. 228/101 |
| 2008/0213613 | A1 * | 9/2008 | Kuramoto et al. ........... 428/577 |

FOREIGN PATENT DOCUMENTS

| | | |
|---|---|---|
| JP | 2-251145 | 10/1990 |
| JP | 6-125169 | 5/1994 |
| JP | 7-74459 | 3/1995 |
| JP | 9-27516 | 1/1997 |
| JP | 11-186334 | 7/1999 |
| JP | 2000-94179 | 4/2000 |
| JP | 2000-332055 | 11/2000 |
| JP | 2001-329048 | 11/2001 |
| JP | 2002-26070 | 1/2002 |
| JP | 2004-274000 | 9/2004 |
| WO | 2004/070827 | 8/2004 |

OTHER PUBLICATIONS

"*Electronics Packaging Technology*", Sep. 2000, pp. 38-45.

Masahiro Yasuda et al., "*Self-Organized Joining Assembly Process by Electrically Conductive Adhesive Using Low Metling Point Fillers*", 10th Symposium on "Microjoining and Assembly Technology in Electronics", Feb. 5-6, 2004, pp. 183-188.

Masahiro Rito et al., "*Assembly Process by Electrically Conductive Adhesive Using Low Melting Point Fillers*", 9th Symposium on "Microjoining and Assembly Technology in Electronics", Feb. 6-7, 2003, pp. 115-120.

Yasuhisa Kaga et al., "*Development of Soldering Technique through Super Solder*", Technical Report of IEICE, EMD 96-15, Jun. 1996, pp. 23-31.

Kiyokazu Yasuda et al., "*Self-Organized Packaging using Polymer Containing Low-Melting-Point-Metal Filler-Process Simulation of Viscous Multi Phase Flow Fluid-*", 11th Symposium on "Microjoining and Assembly Technology in Electronics", Feb. 3-4, 2005, pp. 239-244.

Takayuki Yamada et al., "*Self-organized Packaging by Polymer Containing Low Melting Point Metal-Experimental Verification of Process Rule Factors of Self-organization-*", 11th Symposium on "Microjoining and Assemble Technology in Electronics", Feb. 3-4, 2005, pp. 245-250.

Koushi Ohta et al., "*Study of Self-Organization Assembly Process Based on MARS Method 3-Dimensional 2-phase Flow Analysis*", 12th Symposium on "Microjoining and Assembly Technology in Electronics", Feb. 3-4, 2006, pp. 381-386.

Masao Toya, et al., "*Experimental Verification of Lateral Flow Effects in Resin Containing Solder Fillers on Self-Organization Joining Process*", MES2006 (micro electronics symposium), pp. 335-338.

Masaru Yamashita et al., "*Analysis Concerning the Coalescence Behavior of Metal Droplet in Self-organization Assembly Process*", 13th Symposium on "Microjoining and Assembly Technology in Electronics", Feb. 1-2, 2007, pp. 55-60.

Patent Cooperation Treaty (PCT) International Preliminary Report on Patentability, issued on Sep. 18, 2007 in International Application No. PCT/JP2006/304891.

* cited by examiner

FLIP CHIP MOUNTING PROCESS AND BUMP-FORMING PROCESS USING ELECTRICALLY-CONDUCTIVE PARTICLES AS NUCLEI

TECHNICAL FIELD

The present invention relates to a process for mounting an electronic component such as a semiconductor chip over another electronic component such as a circuit substrate. The present invention also relates to a process for forming bumps on electrodes of an electronic component such as a circuit substrate or a semiconductor chip.

BACKGROUND of THE INVENTION

In recent years, electronic devices such as a cellar phone, a notebook-size personal computer, PDA and a digital video camera have been increasingly used, and they are becoming smaller, thinner and lighter. There has been also increasing a demand for a high performance and a multifunction of the electronic devices. As a result, electronic components such as a semiconductor device and a circuit component are becoming ultrasmall, and thereby a mounting process or a packaging process of the electronic components has been improved. Also, a high-density process of an electronic circuit has been rapidly improved.

The technology needed for the high-density process of the electronic circuit is a high-density mounting technology or a high-density packaging technology for a semiconductor integrated circuit (LSI). With a rapid development of a high pin-number and a fine pitch for connecting electrodes (which are hereinafter referred to also as "electrode(s)") of a LSI chip, semiconductor packaging technologies such as CSP (chip size package) by performance of the flip chip mounting of a bare chip as well as PPGA and BGA mounting processes for external terminals have been commonly used. Therefore, there is a demand for a new mounting technology or a new packing technology that can accommodate a high-speed processing and a miniaturization of a mounted IC as well as a high number of input/output terminals of the mounted IC.

In a flip chip mounting process, firstly, a plurality of electrode pads are formed on a semiconductor chip. Then, bumps are formed on the electrode pads by using a material such as a solder, Au or the like. Subsequently the semiconductor chip is mounted over a circuit substrate such that the bumps of the semiconductor chip are opposed to a plurality of electrodes formed on the circuit substrate. This results in a formation of an electrical conduction between the bumps and the electrodes. After that, a resin material (underfill agent) is poured into a clearance gap between the semiconductor chip and the circuit substrate so as to form a mechanical connection between the semiconductor chip and the circuit substrate.

For mounting a next-generation LSI having 5000 or more electrodes over a circuit substrate, it is required to form fine-pitch bumps with their pitch of 100 µm or less. It is, however, difficult for a conventional solder bump-forming process to form such fine-pitch bumps.

Moreover, from a viewpoint that a large number of bumps must be formed according to the number of the electrodes, a high productivity is required for reducing a manufacturing cost by reducing mounting tact time per chip.

There has been developed a plating process and a screen printing process as a conventional bump-forming process. The plating process is suitable for achieving a fine pitch, but it is complicated and has to compromise the productivity. The screen printing process, on the other hand, has a high productivity, but is not suitable for achieving the fine pitch since a mask is used.

Recently, there has been proposed several processes for selectively forming solder bumps on electrodes of a LSI chip or a circuit substrate. These processes are not only suitable for a fine chip of the bumps, but also suitable for achieving a high productivity since a plurality of the fine bumps can be formed in a batch process. Accordingly they are expected as promising processes that can be applicable to a mounting or packaging for the next-generation LSI.

According to one of these promising processes, a solder paste comprising a mixture of solder powder and a flux is applied directly onto a whole surface of a circuit substrate having electrodes (surfaces of the electrodes have been oxidized). Subsequently the circuit substrate is heated so as to melt the solder powder. As a result, solder bumps (solder layers) are selectively formed on the electrodes without causing an electrical short circuit between the adjacent electrodes. See Japanese Patent Kokai Publication No. 2000-94179 (which is referred to also as "Patent literature 1"), for example.

According to another one of the promising processes, a paste composition (so-called "deposition type solder using chemical reaction") mainly comprising organic acid lead salt and tin metal is applied onto a whole surface of a circuit substrate, the surface being provided with electrodes. Subsequently the circuit substrate is heated so as to induce a displacement reaction for Pb and Sn, and thereby Pb/Sn alloy is selectively deposited on the electrodes of the circuit substrate. See Japanese Patent Kokai Publication No. H01-157796 (which is referred to also as "Patent literature 2") and "Electronics Packaging Technology", issued on September, 2000, pp. 38-45 (which is referred to also as "Non-patent literature 1"), for example.

There is also another process wherein bumps are selectively formed on electrodes of a circuit substrate. In this process, the circuit substrate is immersed in a chemical solution so as to form an adhesive film only on surfaces of the electrodes of the circuit substrate. Then, solder powder is put into contact with the adhesive film so as to attach the solder powder to the electrodes. See Japanese Patent Kokai Publication No. H07-74459 (which is referred to also as "Patent literature 3"), for example.

However, when the above-mentioned processes are employed, the flip chip mounting process requires the following steps (1) and (2) due to the fact that the bumps are formed on the electrode pads of the semiconductor chip or on the electrodes of the circuit substrate:

(1) The step for forming an electrical connection between the opposed electrodes by performance of a reflow process after the formation of the bumps and the mounting of the semiconductor chip over the circuit substrate; and (2) The step for pouring an underfill resin into a clearance gap formed between the semiconductor chip and the circuit substrate so as to secure the semiconductor chip to the circuit substrate.

The steps (1) and (2) will cause an increase of the manufacturing cost.

Therefore, there is recently proposed another process. According to such process, an electrical connection is formed at desired position by disposing a film consisting of an anisotropic conductive material (which contains electrically-conductive particles) between a projected electrode of a semiconductor chip and an electrode of a circuit substrate, followed by heating and pressurizing the film. See Japanese Patent Kokai Publication No. 2000-332055 (which is referred to also as "Patent literature 4"), for example.

There is also proposed another process wherein an electrically-conductive adhesive consisting of a thermosetting resin and electrically-conductive particles is supplied between a semiconductor chip and a circuit substrate, and thereafter the semiconductor chip is pressurized and the electrically-conductive adhesive is heated. According to this process, the molten electrically-conductive particles are allowed to gather between electrodes of the semiconductor chip and electrodes of the circuit substrate. As a result, an electrical conduction between each electrode of the semiconductor chip and each electrode of the circuit substrate is formed, and also a bonding between the semiconductor chip and the circuit substrate is formed. See Japanese Patent Kokai Publication No. 2004-260131 (which is hereinafter referred to also as "Patent literature 5"), for example.

DISCLOSURE OF THE INVENTION

Problems to be Solved by the Invention

However, in a case where an adhesive resin comprising the electrically-conductive particles (e.g., solder powder) is interposed between the semiconductor chip and the circuit substrate, followed by the adhesive resin being pressed and heated so that the melted electrically-conductive particles automatically gather between each electrode of the semiconductor chip and each electrode of the circuit substrate, a viscosity of the adhesive resin gradually increases as the polymerization thereof proceeds (the polymerization being brought about by the heating), as a general rule. Therefore, a mobility of the melted electrically-conductive particles is impaired due to the viscosity increase of the adhesive resin. As a result, there may be occurred a problem that a part of the electrically-conductive particles is left outside of the region formed between each electrode of the semiconductor chip and each electrode of the circuit substrate, which will lead to a deterioration of electrical insulating properties at the region located between the neighboring electrodes.

The present invention is directed to solve the above problem. That is to say, an object of the present invention is to provide a satisfactory flip chip mounting process and a satisfactory bump-forming process in terms of a prevented short-circuit and thus in terms of a connecting reliability.

Means for Solving the Problems

In order to solve the above problem, the present invention provides a flip chip mounting process for electrically interconnecting a first electronic component and a second electronic component, the process comprising the steps of:

(i) preparing a first electronic component on which a plurality of electrodes (a) (which can be referred to also as "connecting terminals") are formed, and also preparing a second electronic component on which a plurality of electrodes (b) (which can be referred to also as "electrode terminals") are formed;

(ii) disposing electrically-conductive particles on the electrodes (a) and/or the electrodes (b);

(iii) supplying a composition comprising solder powder (or "solder particles"), a convection additive and a resin component onto the second electronic component;

(iv) bringing the first electronic component into contact with the supplied composition such that the electrodes (a) are opposed to the electrodes (b); and (v) heating the supplied composition, and thereby connections (referred to also as "solder layers") which electrically interconnect the electrodes (a) and the electrodes (b) are formed from the electrically-conductive particles and the solder powder.

In the step (v), since the composition is heated up to a temperature enabling the solder powder to melt, the convection additive boils or is decomposed so as to generate a gas. The generated gas produces a convection phenomenon in the interior of the supplied composition. Since the convection phenomenon promotes the movement of the solder powder, the solder powder can move freely within the composition. In this case, the electrically-conductive particles serve as nuclei for the solder powder to self-assemble and grow. As a result, the melted solder powder is allowed to self-assemble and grow in the vicinity of the electrically-conductive particles, which leads to a formation of the connections that respectively interconnect the opposed electrodes electrically. In this regard, please be noted, however, that the self-assembly of the melted solder powder is attributable to wettability of the electrically-conductive particles and/or electrodes with respect to the solder powder.

In the flip chip mounting process of the present invention, it is preferred that the first electronic component is a semiconductor chip, and the second electronic component is a circuit substrate.

The electrically-conductive particles may be any suitable ones as long as they are made of an electrically-conductive material. For example, it is preferred that the electrically-conductive particles are at least one kind of particles selected from the group consisting of metal particles made of a single metal component, solder particles, plated metal particles and plated resin particles. In particular, examples of "metal particles made of a single metal component" include metal particles made of a metal component such as Cu, Ag, Au, Ni, Pt, Sn, Bi, Zn or the like. Examples of "solder particles" include solder particles made of an alloy such as Sn—Pb alloy, Sn—Ag alloy, Sn—Ag—Cu alloy, Sn—Bi—Ag—In alloy, Sn—Bi—Zn alloy, Sn—Bi—Ag—Cu alloy, Sn—Zn alloy, Sn—Sb alloy, Sn—Pb—Ag alloy or the like. Examples of "plated metal particles" include metal particles plated with at least one metal material selected from the group consisting of Cu, Ag, Au, Ni and Sn wherein the metal particles themselves are made of at least one metal material selected from the group consisting of Cu, Ag, Au, Ni, Pt, Sn, Bi and Zn. Examples of "plated resin particles" include resin particles plated with at least one metal material selected from the group consisting of Cu, Ag, Au, Ni and Sn wherein the resin particles themselves are made of at least one material selected from the group consisting of epoxy resin, phenolic resin, polyimide resin, polyamide resin, melamine resin, unsaturated polyester resin, alkyd resin, cyanate resin, divinylbenzene polymer, divinylbenzene-styrene copolymer, divinylbenzene-acrylic ester copolymer, diallyl phthalate polymer, triallylisocyanate polymer, benzoguanamine polymer, polyethylene, polypropylene, polymethylpentene, polyvinyl chloride, polytetrafluoroethylene, polystyrene, polymethylmethacrylate, polyethylene terephthalate, polybutylene terephthalate, polysulphone, polyphenylene oxide and polyacetal resin. It is preferred that a diameter of each electrically-conductive particle is between 1 μm and 50 μm. According to the present invention, the electrically-conductive particles are disposed or arranged on the electrodes. In this regard, it is preferred that the electrically-conductive particles are fixed or anchored on the electrodes.

In a preferred embodiment, the resin component is cured to form a resin layer which bonds between the first electronic component and the second electronic component in the step (v).

It is preferred that the resin component that is contained in the composition supplied in the step (iii) is at least one resin (or "base resin of thermoset resin") selected from the group consisting of epoxy resin, unsaturated polyester resin, alkyd resin, polybutadiene resin, polyimide resin, polyamide resin and cyanate resin. A curing agent or a cross-linking agent may be contained in the resin component. Examples of the curing agent or the cross-linking agent include aliphatic amine, aromatic amine, aliphatic acid anhydride, cycloaliphatic acid anhydride, organic peroxide and polybasic acid. It is preferred that the composition supplied in the step (iii) is in paste form or in sheet form.

The convection additive, which is contained in the composition supplied in the step (iii), preferably boils or is preferably decomposed so as to generate a gas at a desired temperature. For example, it is preferred that a boiling point of the convection additive is between a curing reaction-initiating temperature ($T_0$) of the resin component and a peak temperature ($T_1$) of the curing reaction of the resin component. Alternatively, it is preferred that the convection additive is decomposed to generate a gas under a temperature condition between a curing reaction-initiating temperature ($T_0$) of the resin component and a peak temperature ($T_1$) of the curing reaction of the resin component. "Curing reaction-initiating temperature ($T_0$)" used herein is one as shown FIG. 9. Namely, in a DSC curve obtained from a differential scanning calorimetry for a resin component, the curing reaction-initiating temperature ($T_0$) is a temperature at the intersection of a baseline and a tangent line passing through an inflection point P (such inflection point P being located in a curve section rising toward an exothermic peak). Similarly, the peak temperature ($T_1$) of the curing reaction is a temperature at an exothermic peak in the DSC curve obtained from a differential scanning calorimetry for the resin component. The term "differential scanning calorimetry" used herein is a calorimetry by using a differential scanning calorimeter (Seiko Instruments Inc., DSC220) wherein the resin component charged in a sample pan (which is made of aluminum) is heated from a room temperature at a rise rate of 10° C./min.

As the convection additive, a decomposition-type convection additive (i.e., convection additive capable of being decomposed so as to generate a gas) and a evaporation-type convection additive (i.e., convection additive capable of boiling so as to generate a gas) may be used. In particular, examples of "decomposition-type convection additive" include sodium hydrogen carbonate, ammonium metaborate, aluminum hydroxide, dawsonite and barium metaborate. Examples of "evaporation-type convection additive" include a medium-boiling solvent or a high-boiling solvent such as butyl carbitol, isobutyl alcohol, xylene, isopentyl alcohol, butyl acetate, tetrachlorethylene, methyl isobutyl ketone, ethyl carbitol and ethylene glycol. In this regard, however, a mixture consisting of the above materials may be used as the convection additive.

In a preferred embodiment, the solder powder, which is contained in the composition supplied in the step (iii), a conventional solder material such as Pb—Sn alloy can be used. Some solder materials that have been recently developed in terms of an environmental problem may be used. The examples of such solder materials include Pb-free solder material such as Sn—Ag alloy, Sn—Ag—Cu alloy, Sn—Bi—Ag—In alloy, Sn—Bi—Zn alloy, Sn—Bi—Ag—Cu alloy, Sn—Zn alloy or Sn—Sb alloy.

The present invention also provides a flip chip assembly obtained by performance of the above-mentioned flip chip mounting process. In this flip chip assembly of the present invention, a plurality of electrodes (a) formed on a first electronic component are electrically connected to a plurality of electrodes (b) formed on a second electronic component. It is preferred that the first electronic component is a semiconductor chip, and the second electronic component is a circuit substrate.

Furthermore, the present invention provides a bump-forming process in addition to the flip chip mounting process. According to the bump-forming process of the present invention, a plurality of bumps can be formed on a plurality of electrodes of an electronic component. The process for forming bumps of the present invention comprises the steps of:

(i) preparing an electronic component on which a plurality of electrodes (which can be referred to also as "electrode terminals" or "connecting terminals") are formed, and also preparing a cover having release properties (which can be referred to also as "lid member having release properties");

(ii) disposing electrically-conductive particles on the electrodes of the electronic component;

(iii) supplying a composition comprising solder powder, convection additive and a resin component onto a surface (A) of the electronic component, such surface (A) being provided with the electrodes;

(iv) bringing the cover into contact with the supplied composition;

(v) heating the supplied composition, and thereby bumps are formed on the electrodes from the electrically-conductive particles and the solder powder, and also a resin layer is formed between the electronic component and the cover from the resin component; and (vi) removing the cover.

In the step (vi), the removal of the resin layer may be performed in addition to the removal of the cover.

In the step (v), since the composition is heated up to a temperature enabling the solder powder to melt, the convection additive boils or is decomposed so as to generate a gas. The generated gas produces a convection phenomenon in the interior of the supplied composition. Since the convection phenomenon promotes the movement of the solder powder, the solder powder can move freely within the composition. In this case, the electrically-conductive particles serve as nuclei for the solder powder to self-assemble and grow. As a result, the melted solder powder is allowed to self-assemble and grow in the vicinity of the electrically-conductive particles, which leads to a formation of the bumps on the electrodes.

In the process for forming bumps of the present invention, it is preferred that the electronic component is a semiconductor chip or a circuit substrate. It is preferred that the electrically-conductive particles are at least one kind of particles selected from the group consisting of metal particles made of a single metal component, solder particles, plated metal particles and plated resin particles. In particular, as with the flip chip mounting process as described above, examples of "metal particles made of a single metal component" include metal particles made of a metal component such as Cu, Ag, Au, Ni, Pt, Sn, Bi, Zn or the like. Examples of "solder particles" include solder particles made of an alloy such as Sn—Pb alloy, Sn—Ag alloy, Sn—Ag—Cu alloy, Sn—Bi—Ag—In alloy, Sn—Bi—Zn alloy, Sn—Bi—Ag—Cu alloy, Sn—Zn alloy, Sn—Sb alloy, Sn—Pb—Ag alloy or the like. Examples of "plated metal particles" include metal particles plated with at least one metal material selected from the group consisting of Cu, Ag, Au, Ni and Sn wherein the metal particles themselves are made of at least one metal material selected from the group consisting of Cu, Ag, Au, Ni, Pt, Sn, Bi and Zn. Examples of "plated resin particles" include resin particles plated with at least one metal material selected from the group consisting of Cu, Ag, Au, Ni and Sn wherein the resin particles themselves are made of at least one material selected from the group consisting of epoxy resin, phenolic resin, polyimide resin, polyamide resin, melamine resin, unsaturated polyester resin, alkyd resin, cyanate resin, divinylbenzene polymer, divinylbenzene-styrene copolymer, divinylbenzene-acrylic ester copolymer, diallyl phthalate polymer, triallylisocyanate polymer, benzoguanamine polymer, polyethylene, polypropylene, polymethylpentene, polyvinyl chloride, polytetrafluoroethylene, polystyrene, polymethylmethacrylate, polyethylene terephthalate, polybutylene terephthalate, polysulphone, polyphenylene oxide and polyacetal resin. As with the flip chip mounting process as described above, it is preferred that a diameter of each electrically-conductive particle is between 1 μm and 50 μm. According to the present invention, the electrically-conductive particles are disposed or arranged on the electrodes. In this regard, it is preferred that the electrically-conductive particles are fixed or anchored on the electrodes.

In a preferred embodiment, it is preferred that the resin component that is contained in the composition supplied in the step (iii) is at least one resin selected from the group consisting of epoxy resin, unsaturated polyester resin, alkyd resin, polybutadiene resin, polyimide resin, polyamide resin and cyanate resin. A curing agent or a cross-linking agent may be contained in the resin component. Examples of the curing agent or the cross-linking agent include aliphatic amine, aromatic amine, aliphatic acid anhydride, cycloaliphatic acid anhydride, organic peroxide and polybasic acid. The resin component may be one that is not cured upon being heated and has a mobility upon being cooled. It is preferred that the composition supplied in the step (iii) is in paste form or in sheet form.

It is preferred that the cover prepared in the step (i) is a plate made of at least one resin selected from the group consisting of silicone resin, fluorine resin (fluoroplastic) and polypropylene resin. It is also preferred that the cover prepared in the step (i) is a plate coated with at least one material selected from the group consisting of silicone oil, inorganic oxide, inorganic nitride and inorganic nitrided oxide.

In a preferred embodiment, between the step (i) and step (ii), there is provided an additional step for forming a release agent layer on the surface (A) of the electronic component except for a surface region provided with the electrodes; and in the step (vi), not only the cover is removed, but also the resin layer and the release agent layer are removed.

In a preferred embodiment, a plurality of lands are formed on a surface (B) of the cover prepared in the step (i) so that a land pattern of the cover corresponds to that of the electrodes of the electronic component, and also a release agent layer is formed on the surface (B) of the cover except for a surface region provided with the lands;

in the step (iv), the cover is brought into contact with the supplied composition such that the lands of the cover are opposed to the electrodes of the electronic component;

in the step (v), bumps which interconnect the lands and the electrodes are formed from the electrically-conductive particles and the solder powder; and in the step (vi), the cover and the release agent layer are removed whereas the lands are left to remain on the bumps.

The release agent layer which is formed on the cover prepared in the step (i) may be thicker than the lands.

It will be understood that the present invention also provides a bump package obtained by performance of the above-mentioned bump-forming process, wherein bumps are formed on a plurality of electrodes formed on an electronic component.

EFFECT OF THE INVENTION

According to the present invention, the moving solder powder can be efficiently captured by the electrically-conductive particles disposed on the electrodes, which leads to a formation of the connections (i.e., "solder layer") or bumps.

In particular, the flip chip mounting process of the present invention can reduce a amount of the residual solder powder that is left outside of electrodes or outside of the region between the opposed electrodes, which will lead to a prevention of the short-circuit. As a result, a high productivity of the flip chip mounting process is achieved as well as a high connecting reliability of the obtained flip chip assembly is achieved.

Similarly, the bump-forming process of the present invention can efficiently capture the solder powder by the electrically-conductive particles disposed on the electrodes of the electronic component. As a result, a large number of bumps can be formed with a satisfactory productivity. In the obtained bump package, the bumps with uniform shapes are formed and an improvement of electrical insulating properties is achieved at the region between the neighboring bumps, which leads to a high reliability.

Figure 1:
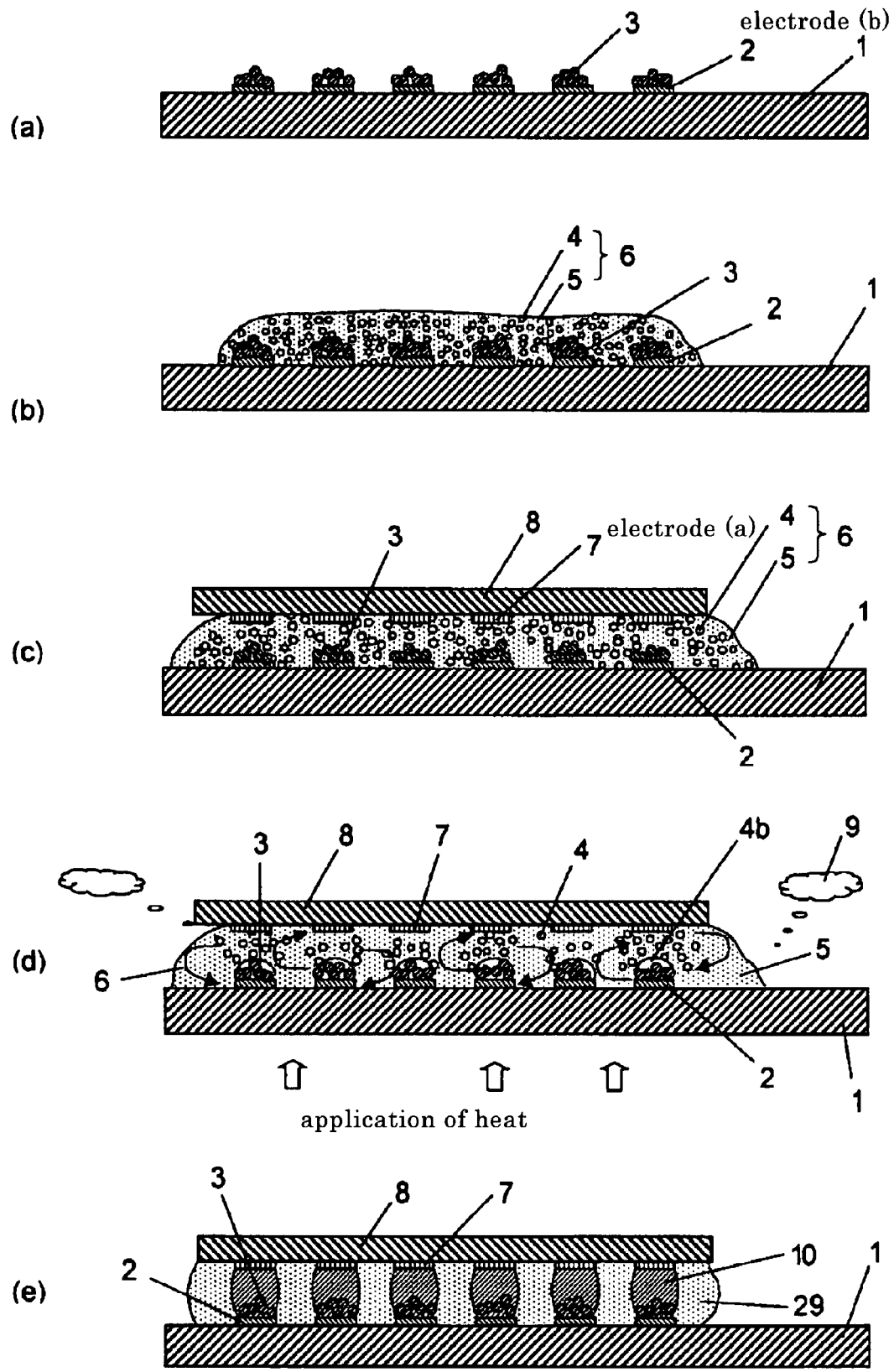
FIGS. 1(a) to 1(e) show cross-sectional views illustrating the steps in a flip chip mounting process of the present invention according to the first embodiment.

In the drawings, the reference numbers correspond to the following elements:
1: Second electronic component (e.g., circuit substrate)
2: Electrode (b) (e.g., electrode terminal) of Second electronic component
3, 3a, 3b, 23: Electrically-conductive particles
4, 24: Solder powder
4a: Melted solder powder
4b, 24b: Molten solder
5, 25: Resin component
6, 26: Composition (resin composition)
7: Electrode (a) (e.g., connecting terminal) of first electronic component
8: First electronic component (e.g., semiconductor chip)
9, 28: Gas generated from convection additive.
10: Connection (solder layer)
21: Electronic component
22: Electrode
29: Resin layer
30, 45, 55: Bump
31, 43, 53: Release agent layer
27, 41, 51: Cover having release properties
42, 52: Land
44, 54: Top of bump (projecting portion of bump)

BEST MODES FOR CARRYING OUT THE INVENTION

With reference to the attached drawings, a few embodiments of the present invention will be hereinafter described. As to the drawings, the constituent elements having substantially the same function carry the same reference number for ease of the description.

The First Embodiment

FIG. 1 shows cross-sectional views illustrating the steps in a flip chip mounting process of the present invention according to the first embodiment.

Firstly, as shown in FIG. 1(a), electrically-conductive particles 3 (e.g., Ag powder) having high wettability to a solder are fixed on electrodes 2 formed on an upper surface of a circuit substrate 1 (i.e., "second electronic component"). In order to fix the electrically-conductive particles 3 on the electrodes 2, the followings can be employed:

The electrically-conductive particles 3 is welded with pressure so as to selectively fix the particles 3 on the electrodes 2;

A paste comprising the electrically-conductive particles 3 is selectively printed on the electrodes 2; and An adhesive flux is applied on surfaces of the electrodes 2 of the circuit substrate 1, and thereafter the electrically-conductive particles 3 are sprinkled on the circuit substrate 1 so that some of the sprinkled particles 3 are fixed on the electrodes 2. Finally, the residual particles 3 that have been unfixed on the electrodes 2 are removed by sweeping. It is preferred in this case that the adhesive flux has a high viscosity (i.e., high viscous properties) so as to strongly fix the electrically-conductive particles 3 on the electrodes 2 even when the melting of the solder is performed.

Next, as shown in FIG. 1(b), a paste resin composition 6 (which is hereinafter referred to also as "composition") is applied onto a surface of a circuit substrate 1, the surface being provided with a plurality of electrodes 2 (i.e., "electrodes (b)"). The paste resin composition 6 comprises a resin component 5, an evaporation-type convection additive and solder powder 4. The solder powder 4 is uniformly dispersed in a mixture of the resin component 5 and the convection additive. As the resin component 5, a thermosetting resin consisting primarily of a bisphenol A type epoxy resin and a dicyandiamide is used. As the evaporation-type convection additive, butyl acetate is used. As the solder 4, Pb—Sn alloy is used.

Next, as shown in FIG. 1(c), a semiconductor chip 8 (i.e., "first electronic component") having a plurality of electrodes 7 (i.e., "electrodes (a)") is brought into contact with an upper surface of the supplied composition 6. In this regard, the semiconductor chip 8 is mounted over the circuit substrate 1 such that the electrodes 7 of the semiconductor chip 8 are opposed to the electrodes 2 of the circuit substrate 1, as shown in FIG. 1(c).

Next, as shown in FIG. 1(d), the circuit substrate 1 is heated, so that a temperature of the resin composition 6 rises. As the temperature rises, the viscosity of the resin composition 6 becomes lower and the convection additive (butyl carbitol) boils to generate a gas 9. The generated gas 9 provides a convection effect (as indicated as an arrow in FIG. 1(d)) in the composition 6 until the gas 9 escapes to the outside. The convection effect allows the solder powder 4 to self-assemble onto the electrodes 2 due to high wettability of the electrically-conductive particles. This results in a formation of connections 10 (or "solder layer") that interconnect the electrodes 2 and the electrodes 7.

Finally, a flip chip assembly wherein each electrode 2 of the circuit substrate 1 is electrically connected to each electrode 7 of the semiconductor chip 8 through each connection 10 is obtained as shown in FIG. 1(e).

Figure 2:
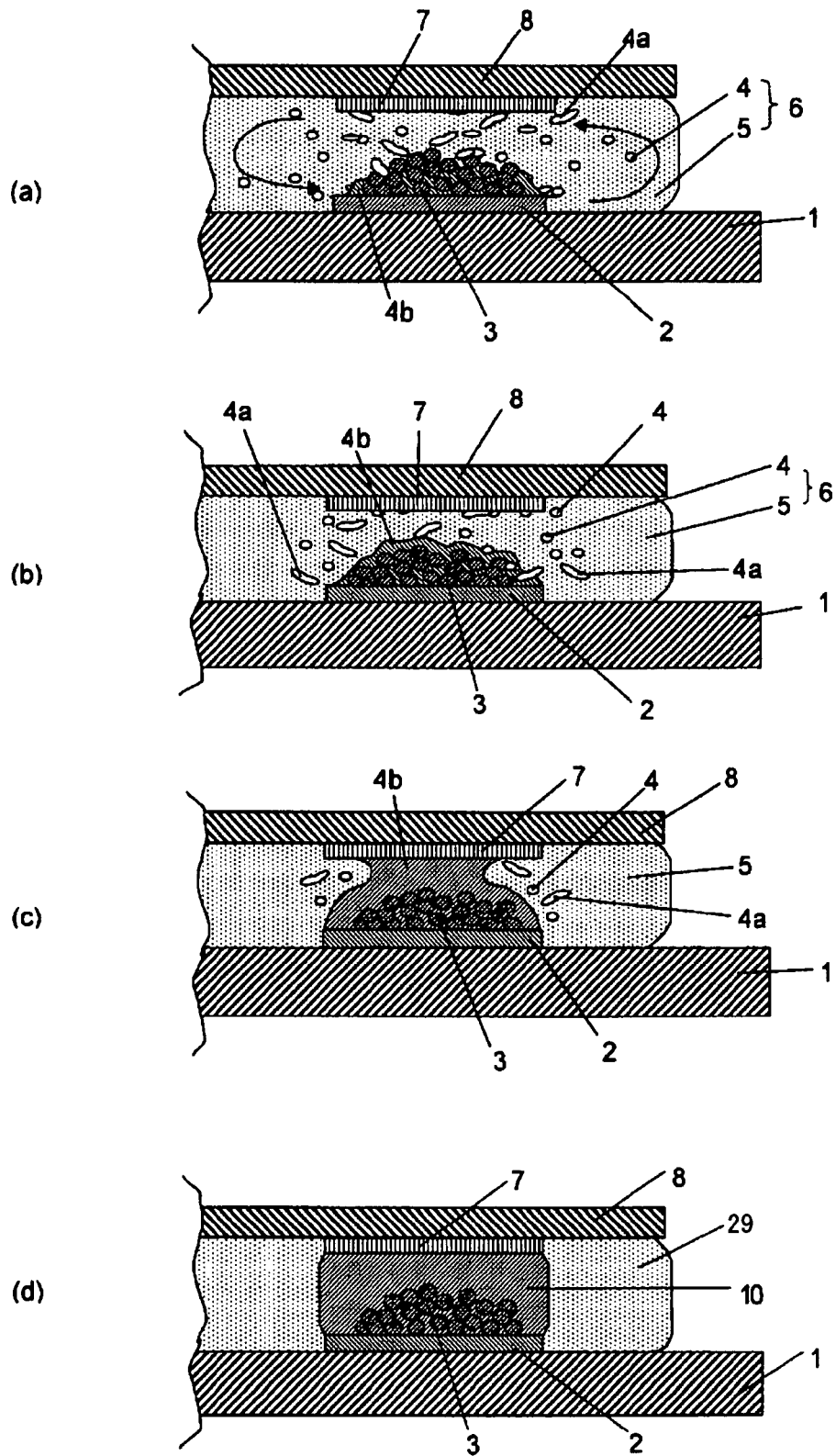
FIGS. 2(a) to 2(d) show fragmentary cross-sectional views illustrating the steps in a flip chip mounting process of the present invention according to the first embodiment.

With reference to FIG. 2, a function of the electrically-conductive particles 3 in the time course of "convection phenomenon" will be hereinafter described in more detail. FIG. 2 shows fragmentary cross-sectional views illustrating the steps in a flip chip mounting process of the present invention according to the first embodiment.

In FIG. 2(a), the solder powder 4 is moving within the resin composition 6 by a convective movement of the gas (not shown) generated due to the temperature rise of the resin composition 6. Due to the high temperature, a part of the solder powder 4 becomes a melted solder powder 4a. Thus, not only the movement of the solder powder 4 but also the movement of the melted solder powder 4a is performed within the resin composition 6. The movement of the solder powder 4 and/or the melted solder powder 4a is suppressed in the vicinity of electrodes 2 by the existence of the electrically-conductive particles 3 fixed on an upper surface of the electrode 2. That is to say, the solder powder 4 and/or the melted solder powder 4a are/is captured by the electrically-conductive particles 3 having high wettability to a solder. This results in a fusion bond between the melted solder powder 4a and the electrically-conductive particles 3, which leads to a formation of a molten solder 4b.

Subsequently, as shown in FIG. 2(b), the molten solder 4b grows by incorporating the solder powder 4 and the melted solder powder 4a which has self-assembled toward the molten solder 4b. In this regard, the electrically-conductive particles 3 serve as a nucleus of the growth. Finally, as shown in FIG. 2(c), an upper surface of the molten solder 4b reaches a surface of electrode 7 of the semiconductor chip 8, and thereby the connection 10 which electrically interconnects the electrode 2 of the circuit substrate 1 and the electrode 7 of the semiconductor chip 8 is obtained (see FIG. 2(d)).

Meanwhile, during the formation of the connection 10, it is possible to cure the resin component 5 that is contained in the resin composition 6 so as to form a resin layer between the circuit substrate 1 and the semiconductor chip 8. This resin layer serves to mechanically bond between the circuit substrate 1 and the semiconductor chip 8. Thus, the present invention has an advantage in that there is no need for a step for filling "underfill resin", such step being indispensable to the prior art.

As the resin component 5 contained in the resin composition 6, the thermosetting resin comprising bisphenol A type epoxy resin is used in the first embodiment, but the present invention is not limited to that. For example, a thermosetting resin comprising a polyimide resin, a cyanate resin or the like may be used, in which case the above mentioned is applicable.

As the electrically-conductive particles, Ag powder is used in the first embodiment, but the present invention is not limited to that. For example, the following powders may be used:
   A metal powder having high wettability to the solder, for example, Au powder, Cu powder or the like;
   A alloy powder of Au and Cu; and
   A resin powder that is plated with the metal (e.g., Cu or solder)

As the electrically-conductive particles 3, solder powder having a melting point higher than that of the solder powder 4 may be used, and thereby it is ensured that the electrically-conductive particles 3 serve as nuclei for capturing the melted solder powder 4a. In this case, after the melted solder powder 4a is captured by the electrically-conductive particles, the solder powder used as the electrically-conductive particles 3 is integrated with the molten solder 4b through a fusion therewith. That is to say, the solder powder used as the electrically-conductive particles 3 not only serves as nuclei for capturing the melted solder powder 4a, but also servers as a raw material for the connections 10.

As the resin composition 6 applied onto the circuit substrate 1, the paste composition is used, but the present invention is not limited to that. For example, a prepreg resin sheet in which the resin composition 6 is preliminarily semi-cured may be used.

The Second Embodiment

Figure 3:
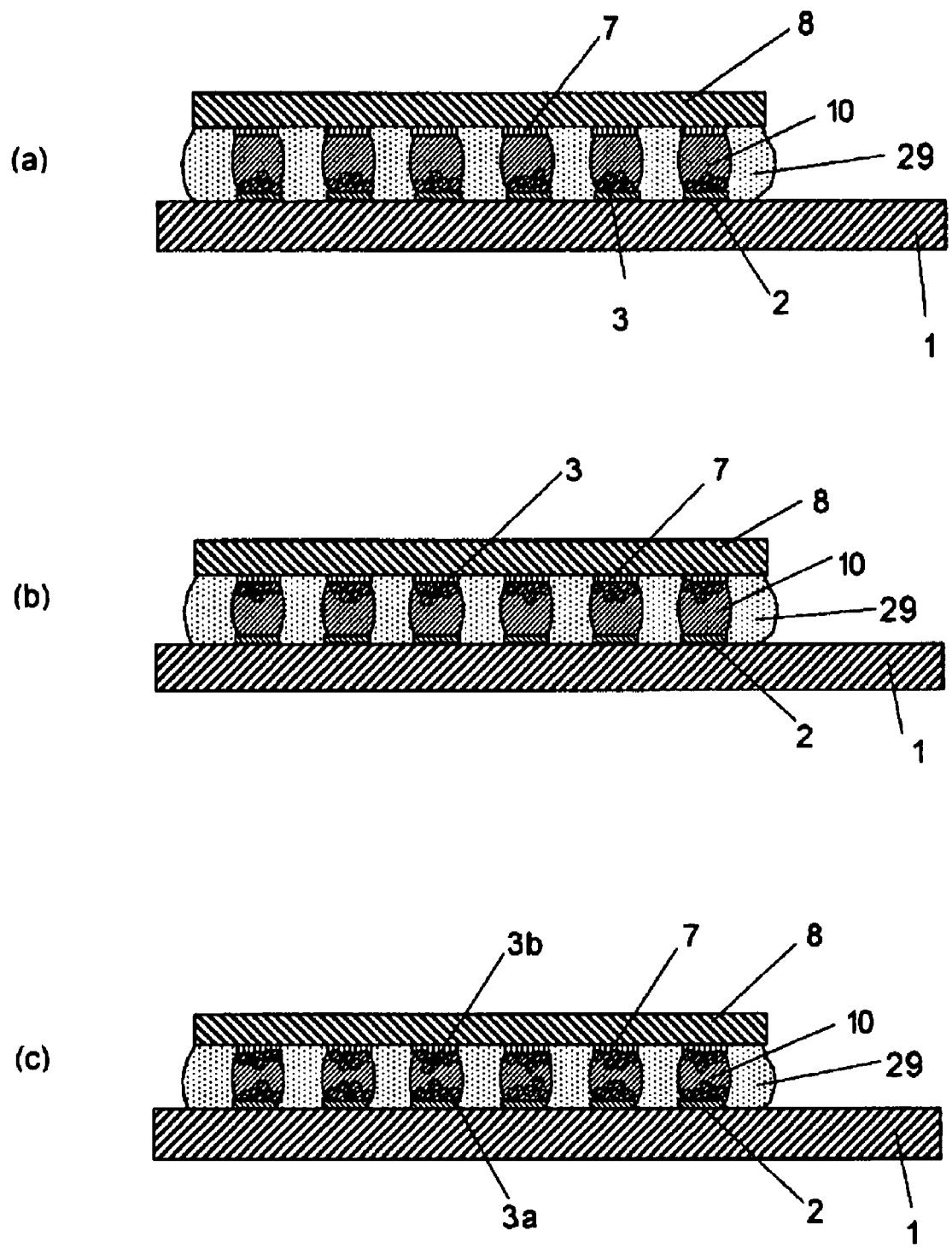
FIGS. 3(a) to 3(c) show cross-sectional views illustrating flip chip assemblies of the present invention according to the second embodiment.

With reference to FIG. 3, a flip chip assembly of the preset invention according to the second embodiment will be hereinafter described.

FIG. 3(a) shows a cross-sectional view illustrating a flip chip assembly of the present invention according to the second embodiment. This flip chip assembly can be obtained by performance of the flip chip mounting process according to the first embodiment. That is to say, the flip chip assembly is obtained by disposing the electrically-conductive particles 3 on the electrodes 2 of the circuit substrate 1, followed by capturing the melted solder powder 4a by the electrically-conductive particles 3 so as to form the connections 10. Each connection 10 of the flip chip assembly is obtained by allowing the molten solder 4b to grow from the electrically-conductive particles 3 serving as a nucleus of growth until the upper surface of the molten solder 4b touches each electrode 7 of the semiconductor chip 8. Each connection 10 serves to electrically interconnect each electrode 2 of the circuit substrate 1 and each electrode 7 of the semiconductor chip 8.

FIG. 3(b) shows a cross-sectional view illustrating a modified example of a flip chip assembly of the present invention according to the second embodiment. The flip chip assembly shown in FIG. 3(b) is obtained by disposing the electrically-conductive particles 3 on the electrodes 7 of the semiconductor chip 1, followed by capturing the melted solder powder 4a by the electrically-conductive particles 3 so as to form the connections 10. Each connection 10 of the flip chip mounting assembly shown in FIG. 3(b) is obtained by allowing the molten solder 4b to grow from the electrically-conductive particles 3 (which is located on the electrodes 7 of the semiconductor chip 8) serving as a nucleus of growth until the upper surface of the molten solder 4b touches each electrode 2 of the circuit substrate 1. As described above, each connection 10 serves to electrically interconnect each electrode 2 of the circuit substrate 1 and each electrode 7 of the semiconductor chip 8.

FIG. 3(c) shows a cross-sectional view illustrating another modified example of a flip chip assembly of the present invention according to the second embodiment. The flip chip assembly shown in FIG. 3(c) is obtained by disposing the electrically-conductive particles 3 not only on the electrodes 2 of the circuit substrate 1 but also on the electrodes 7 of the semiconductor chip 8. Thus, the melted solder powder 4a is captured by the electrically-conductive particles 3a and 3b, and thereby the molten solders 4b grow from the opposed the electrically-conductive particles 3a and 3b. This means that the melted solder powder 4a is allowed to efficiently self-assemble into a region between each electrode 2 and each electrode 7 in a very short period of time so as to form a connection 10, and thereby a high connecting reliability of the flip chip assembly can be achieved.

Although FIG. 3 illustrates that a single semiconductor chip is mounted over the circuit substrate 1, a plurality of semiconductor chips may be mounted over the circuit substrate 1. Similarly, a plurality of chip components (e.g., a plurality of chip resistors or chip capacitors) may be mounted over the circuit substrate 1.

The flip chip assembly of the present invention has an improved connecting reliability regarding an electrical connection between a solder material (which has self-assembled due to the electrically-conductive particles 3, 3a, 3b) and the electrodes 2, 7 (on which the electrically-conductive particles 3, 3a, 3b are fixed). In particular, the flip chip assembly of the present invention is configured to suppress an occurrence of a crack in the connections 10. Thus, in the flip chip assembly of the present invention, a possibility of a poor connection is reduced even when the stress is applied on the connections 10. This means that the flip chip assembly of the present invention has a stress relaxation effect. In a case where resin particles plated with a solder material or a metal material are used as the electrically-conductive particles 3, 3a, 3b, the stress relaxation effect is further increased.

The Third Embodiment

Figure 4:
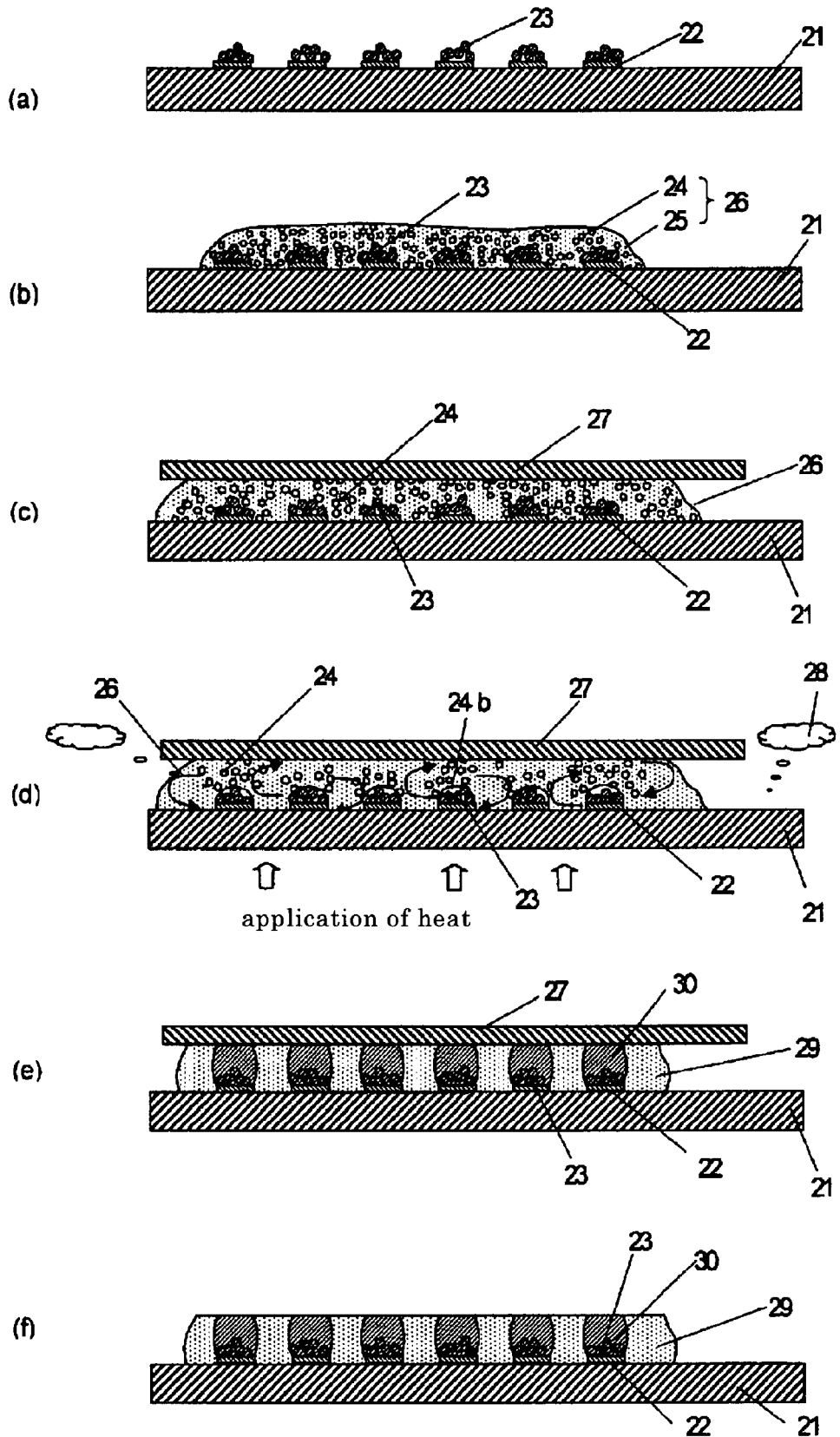
FIGS. 4(a) to 4(f) show cross-sectional views illustrating the steps in a bump-forming process of the present invention according to the third embodiment.

With reference to FIG. 4, a process for forming bumps of the present invention (i.e., a bump-forming process) according to the third embodiment will be hereinafter described. FIG. 4 shows cross-sectional views illustrating the steps in a bump-forming process of the present invention according to the third embodiment.

Firstly, as shown in FIG. 4(a), electrically-conductive particles 23 (for example, Ag powder) having high wettability to a solder are fixed on electrodes 22 (e.g., "electrode terminals" or "connecting terminals") formed on an upper surface of an electronic component 21 (e.g., "semiconductor chip" or "circuit substrate"). In order to fix the electrically-conductive particles 23 on the electrodes 22, an adhesive flux is applied on surfaces of the electrodes 22, and thereafter the particles 23 are sprinkled on the electronic component 21 so that some of the sprinkled particles 3 are fixed on the electrodes 22 of the electronic component 21. Subsequently, the residual particles 23 that have been unfixed on the electrodes 22 are removed by sweeping. It is preferred in this case that the adhesive flux has a high viscosity (i.e., high viscous properties) so as to strongly fix the electrically-conductive particles 23 on the electrodes 22 even when the melting of the solder is performed. Alternatively, a paste comprising the electrically-conductive particles 23 is selectively printed on the electrodes 22 in order to fix the electrically-conductive particles 23 on the electrodes 22.

Next, as shown in FIG. 4(b), a paste resin composition 26 is applied onto an upper surface of the electronic component 21, the upper surface being provided with the electrodes 22. The paste resin composition 26 comprises a resin component 25, a convection additive and solder powder. The solder powder is uniformly dispersed in a mixture of the resin component 25 and the convection additive. As the resin component 25, a thermosetting resin consisting primarily of a bisphenol F type epoxy resin is used. As the convection additive, a liquid mixture of butyl carbitol and isobutyl alcohol is used. As the solder 4, Pb—Sn alloy is used.

Next, as shown in FIG. 4(c), a cover 27 having release properties is brought into contact with an upper surface of the supplied composition 26. In this case, such cover 27 is a plate made of polypropylene resin or the like.

Next, as shown in FIG. 4(d), the electronic component 21 is heated from a lower surface thereof (as indicated as an arrow in FIG. 4(d)) so that a temperature of the resin composition 26 rises. As a result, the viscosity of the resin composition 26 becomes lower, and the convection additive (liquid mixture of butyl carbitol and isobutyl alcohol) boils to generate a gas 28. The generated gas 28 provides a convection effect (as indicated as an arrow in FIG. 4(d)) in the resin composition 26 until the gas 28 escapes to the outside. This convection effect makes it possible to promote the movement of the metal powder 24, and thereby the solder powder 24 is allowed to convect and self-assemble toward the electrodes 22 due to wettability of the electrodes. While the solder powder 24 is convecting and self-assembling, the melting of the solder powder 24 is performed. The movement of the solder powder 24 is suppressed by the existence of the electrically-conductive particles 23 fixed on the electrodes 22. That is to say, the solder powder 24 is captured by the electrically-conductive particles 23 having high wettability to the solder. This results in a fusion bond between the solder powder 24 and the particles 23, which leads to a growth of the molten solder 24b to form bumps.

Next, as shown in FIG. 4(e), after the upper surface of each molten solder 24b reaches the cover 27, the electronic component 21 is cooled. As a result, not only bumps 30 with the electrically-conductive particles 23 included therein are obtained, but also resin layer 29 in which the resin component 25 has been cured is obtained.

Finally, as shown in FIG. 4(f), the cover 27 is removed from the electronic component 21. In particular, the cover 27 is peeled away from the resin layer 29. Since the cover 27 is made of polypropylene resin or the like having no adhesiveness to the resin layer 29, the cover 27 can be easily peeled away from the resin layer 29. In this way, the electronic component 21 in which the bumps 30 with the electrically-conductive particles 23 included therein are formed on the electrodes 22 can be obtained.

In a case where a semiconductor chip is flip chip connected to the obtained electronic component 21, the resin layer 29 may be additionally removed from the electronic component 21.

As the cover 27 having release properties, a plate made of polypropylene resin is used in the third embodiment, but the present invention is not limited to that. For example, a plate made of silicone resin, fluorine resin or the like may be used. A plate coated with a release agent (e.g., silicone oil or the like) may be also used.

It will be noted that the bump-forming process of the present invention is not limited to the third embodiment and can be modified in various ways. A modified embodiment is as follows:

Instead of using the cover having release properties as described above, a cover having low wettability to a solder can be used. For example, a glass cover may be used. In this case, the cover is removed from the resin composition under such a condition that the upper surface of each of the growing molten solder has reached the cover but that the resin component has been not yet cured. Since the cover has low wettability to the solder, the cover can be easily removed from the resin composition. Subsequently, the resin composition located between the neighboring electrodes of the electronic component is removed by performance of an etching process or by using a solvent. As a result, the electronic component having the bumps is obtained, wherein the electrically-conductive particles are included in the bumps formed on one face of the electronic component. It is preferred in this case that the resin component contained in the resin composition is not cured at a temperature enabling a convective movement of the solder powder, and that the resin component still has a mobility upon a cooling step performed after the formation of the bumps.

The Fourth Embodiment

Figure 5:
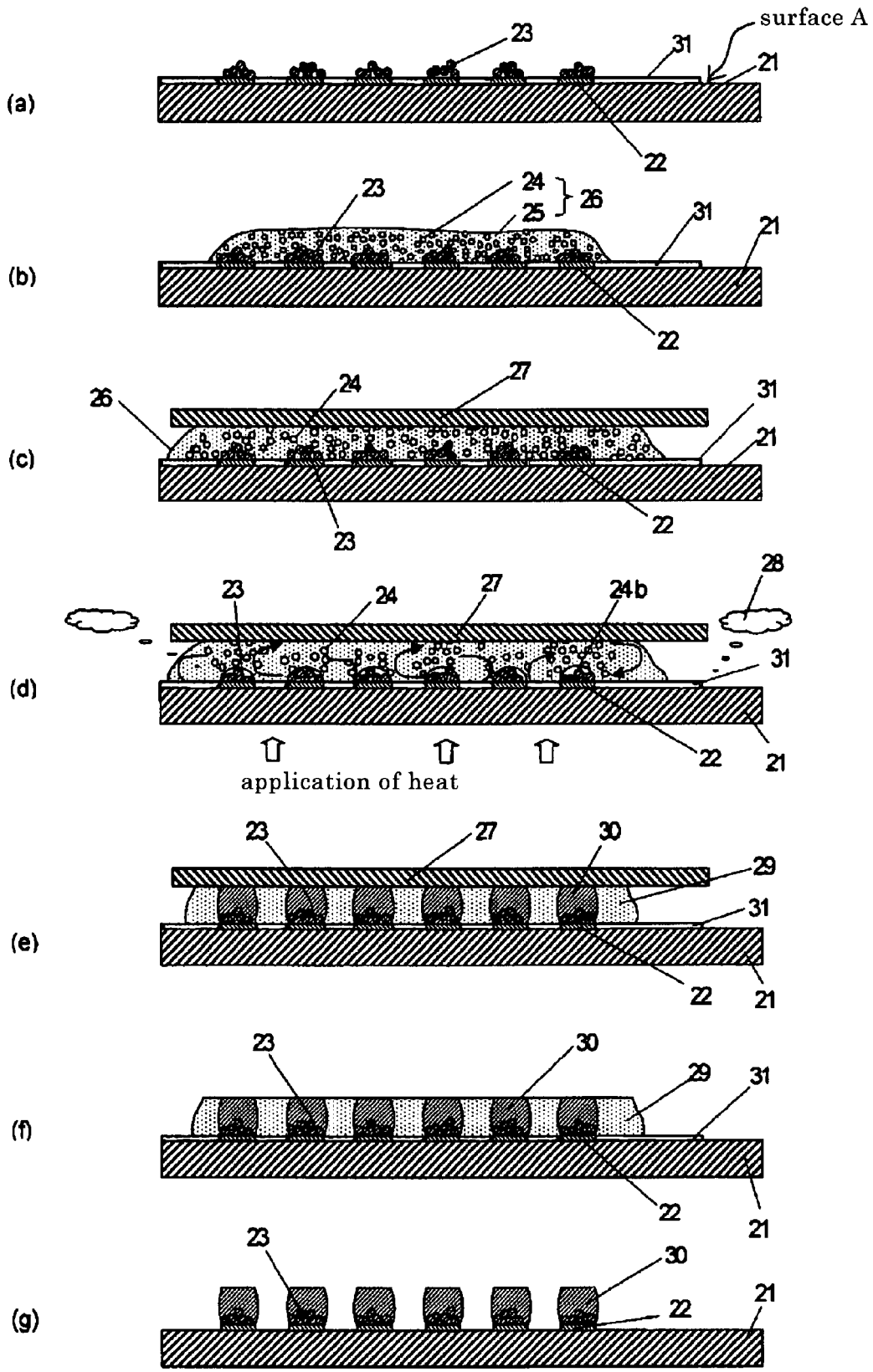
FIGS. 5(a) to 5(g) show cross-sectional views illustrating the steps in a bump-forming process of the present invention according to the fourth embodiment.

With reference to FIG. 5, a process for forming bumps of the present invention according to the fourth embodiment will be hereinafter described. In FIG. 5, the same reference numbers as FIG. 4 are given to the constituent elements having substantially the same function as that of FIG. 4. FIG. 5 shows cross-sectional views illustrating the steps in a process for forming bumps of the present invention according to the fourth embodiment.

Firstly, by performance of a coating method using a release agent (e.g., silicone resin), a release agent layer 31 (or "film having release properties 31") is formed on a surface (A) of an electronic component 21 except for a surface region provided with the electrodes 22 (see FIG. 5(a)). Subsequently, the electrically-conductive particles 23 (e.g., Ag powder) having high wettability to a solder are fixed on the electrodes 22 in a manner similar to the first embodiment.

Next, as shown in FIG. 5(b), a paste resin composition 26 is applied. The paste resin composition 26 comprises a resin component 25, a decomposition-type convection additive and solder powder 24. The solder powder 24 is uniformly dispersed in a mixture of the resin component 25 and the decomposition-type convection additive. As the resin component 25, a thermosetting resin consisting primarily of phthalic anhydride and glycerin is used. As the decomposition-type convection additive, ammonium metaborate is used. As the solder 24, Pb—Sn alloy is used.

Next, as shown in FIG. 5(c), a cover 27 having release properties is brought into contact with an upper surface of the supplied composition 26. In this case, such cover 27 is a polypropylene sheet, a silicone resin sheet or the like.

Next, as shown in FIG. 5(d), the electronic component 21 is heated from a lower surface thereof (as indicated as an arrow in FIG. 5(d)) so that a temperature of the resin composition 26 rises. As a result, the viscosity of the resin composition 26 becomes lower, and the convection additive (ammonium metaborate) is decomposed to generate a gas 28. The generated gas 28 provides a convection effect (as indicated as an arrow in FIG. 5(d)) in the resin composition 26 until the gas 28 escapes to the outside. This convection effect makes it possible to promote the movement of the metal powder 24, and thereby the solder powder 24 is allowed to convect and self-assemble toward the electrodes 22 due to wettability of the electrodes. While the solder powder 24 is convecting and self-assembling, the melting of the solder powder 24 is performed. The movement of the solder powder 24 is suppressed by the existence of the electrically-conductive particles 23 fixed on the electrodes 22. That is to say, the solder powder 24 is captured by the electrically-conductive particles 23 having high wettability to the solder. This results in a fusion bond between the solder powder 24 and the particles 23, which leads to a growth of the molten solder 24b to form bumps.

As with the embodiment which has been described with reference to FIG. 2, the movement of the solder powder 24 and the melted solder powder (not shown) is performed due to "convection phenomenon". Thus, the solder powder 24 and the melted solder powder are allowed to self-assemble toward the electrodes 22, followed by being captured by the electrically-conductive particles 23. Each of the molten solder 4b grows by incorporating the solder powder 4 and the melted solder powder which have self-assembled toward the molten solder 4b. In this regard, the electrically-conductive particles 23 serve as nuclei of the growth.

Next, as shown in FIG. 5(e), after the upper surface of each molten solder 24b reaches the cover 27, the electronic component 21 is cooled. As a result, not only bumps 30 are obtained from the molten solder 24b and the electrically-conductive particles 23, but also resin layer 29 is obtained through a curing process of the resin component 25 contained in the resin composition 26.

Next, as shown in FIG. 5(f), the cover 27 is removed from the electronic component 21. In particular, the cover 27 is peeled away from the resin layer 29. Since the cover 27 is made of polypropylene resin or the like having no adhesiveness to the resin layer 29, the cover 27 can be easily peeled away from the resin layer 29.

Finally, as shown in FIG. 5(g), the resin layer 29 and the release agent layer 31 are removed. As a result, the electronic component 21 having the bumps formed on one face thereof is obtained.

As the release agent for forming the release agent layer 31, silicone resin is used in the fourth embodiment, but the present invention is not limited to that. For example, polypropylene resin, fluorine resin or the like may be used as the release agent for forming the release agent layer. Alternatively, the release agent layer may be formed by performance of a coating method using silicone oil or the like.

The Fifth Embodiment

Figure 6:
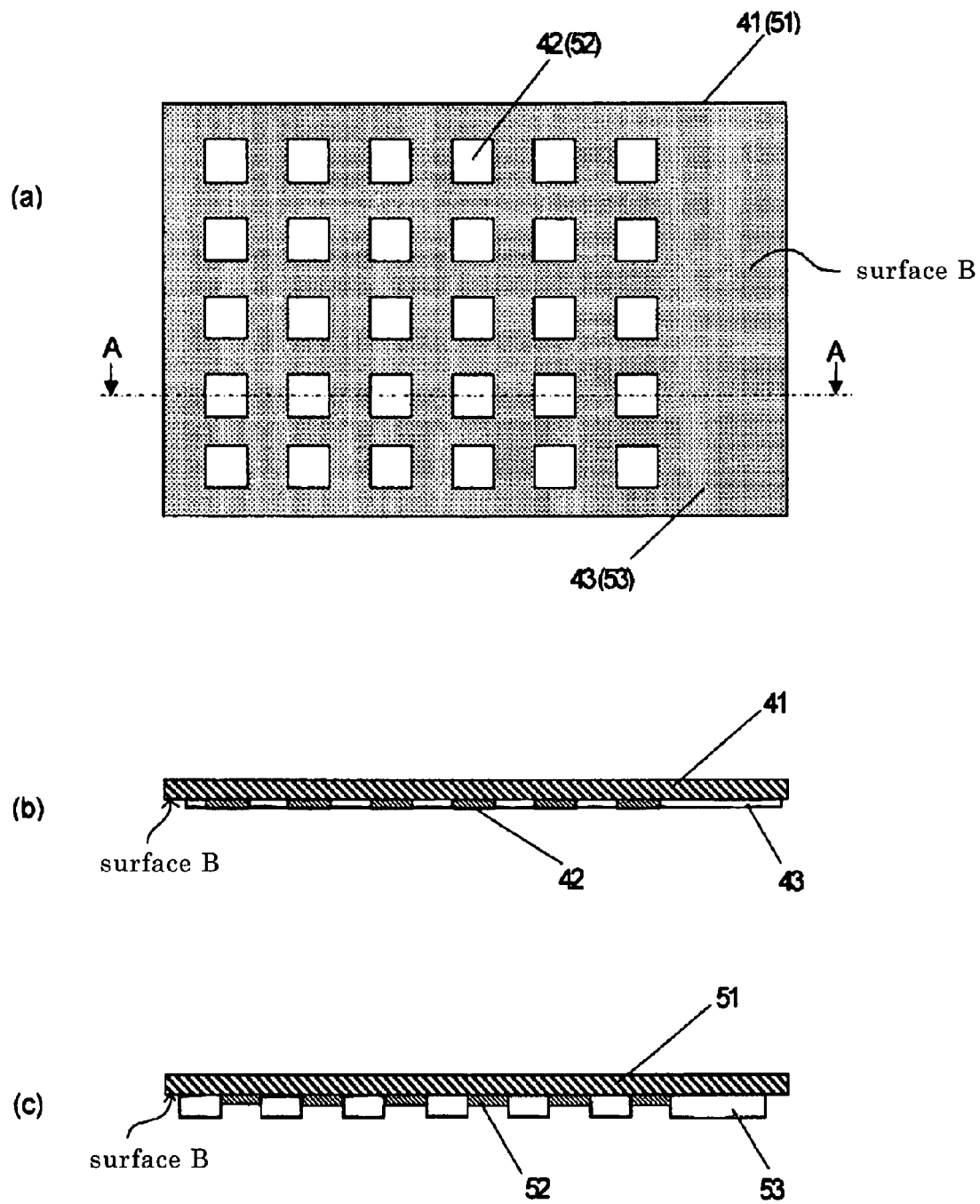
FIGS. 6(a) and 6(b) show a top plan view and a cross-sectional view (taken along the line A-A) illustrating a cover having release properties that is used for a bump-forming process of the present invention according to the fifth embodiment.
FIG. 6(c) shows a cross-sectional view illustrating a modified example of the cover having release properties.
Figure 7:
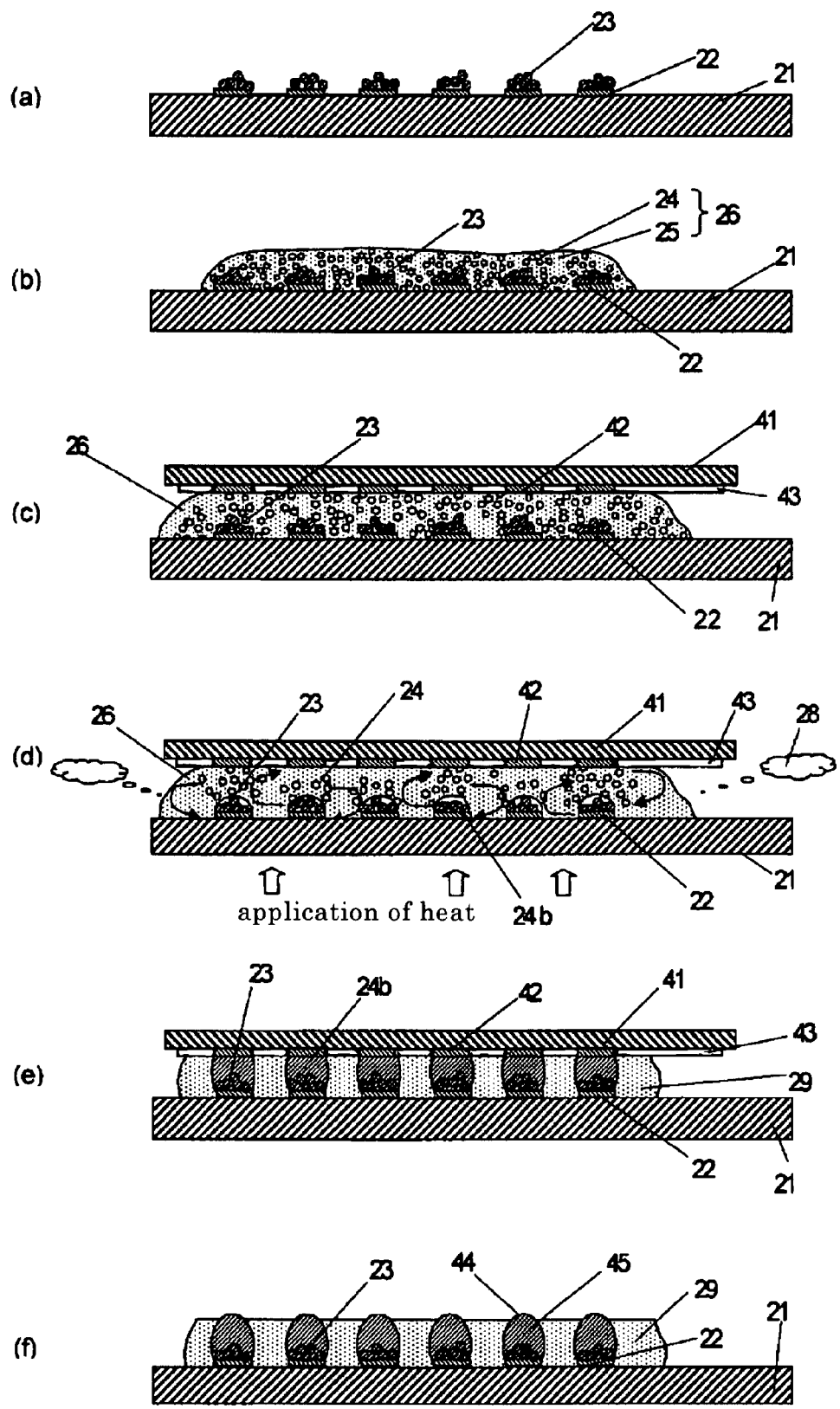
FIGS. 7(a) to 7(f) show cross-sectional views illustrating the steps in a bump-forming process of the present invention according to the fifth embodiment.
Figure 8:
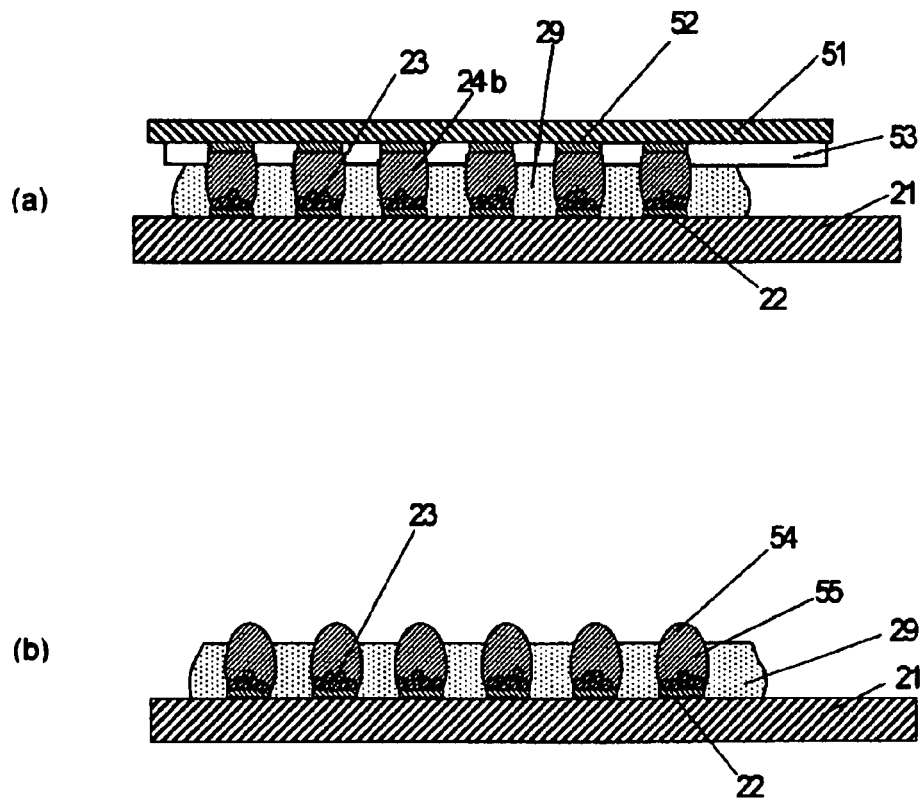
FIGS. 8(a) and 8(b) show cross-sectional views illustrating the steps in a modified example of a bump-forming process of the present invention according to the fifth embodiment.
Figure 9:
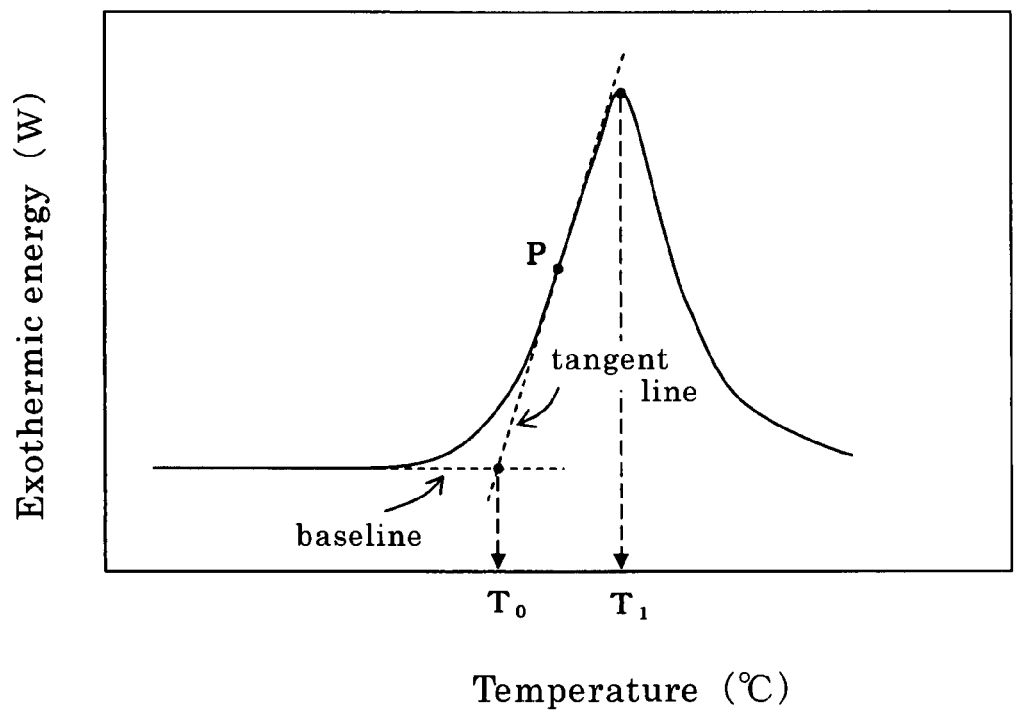
FIG. 9 shows a conceptual diagram of a DSC curve obtained from a differential scanning calorimetry for a resin component.

With reference to FIGS. 6 to 8, a process for forming bumps of the present invention according to the fifth embodiment will be hereinafter described. In FIGS. 6 to 8, the same reference numbers as FIG. 4 are given to the constituent elements having substantially the same function as that of FIG. 4.

FIGS. 6(a) and 6(b) show a top plan view and a cross-sectional view (taken along the line A-A) illustrating a cover having release properties that is used for a process for forming bumps of the present invention according to the fifth embodiment.

In FIG. 6(a), a plurality of lands 42 are formed on a surface (B) of the cover 41. The lands 42 consist of Cu, Sn or the like, for example. A pattern of the plurality of lands preferably corresponds to that of a plurality of electrodes of the electronic component (not shown). In this fifth embodiment, by performance of the coating method using a release agent (e.g., epoxy resin), a release agent layer 43 is formed on the surface (B) of the cover 41 except for a surface region provided with the lands 42.

FIG. 6(c) shows a cross-sectional view (taken along the line A-A) illustrating a modified example of the cover having release properties. As shown in FIG. 6(c), this modified example is characterized in that the release agent layer 53 (which is formed on the surface (B) except for a surface region provided with the lands 52) is thicker the lands 52 (which is also formed on the surface (B)).

With reference to FIG. 7, a process for forming bumps using the cover 41 shown in FIGS. 6(a) and 6(b) will be hereinafter described.

Firstly, as shown in FIG. 7(a), the electrically-conductive particles 23 (e.g., Ag powder) having high wettability to a solder are fixed on electrodes 22 of an electronic component 21 (e.g., semiconductor chip or circuit substrate) in a manner similar to the third embodiment.

Next, as shown in FIG. 7(b), a paste resin composition 26 is applied on an upper surface of the electronic component 21, the upper surface being provided with the electrodes 22. The paste resin composition 26 comprises a resin component 25, a decomposition type-convection additive and solder powder 24. The solder powder 24 is uniformly dispersed in a mixture of the resin component 25 and the decomposition-type convection additive. As the resin component 25, a resin consisting of glycol, maleic anhydride and benzoyl peroxide is used. As the decomposition-type convection additive, sodium hydrogen carbonate is used. As the solder 24, Sn—Zn alloy is used.

Next, as shown in FIG. 7(c), the cover 41 is brought into contact with an upper surface of the supplied composition 26 such that the lands of the cover 41 are opposed to the electrodes 22 of the electronic component 21.

Next, as shown in FIG. 7(d), the electronic component 21 is heated from a lower surface thereof (as indicated as an arrow in FIG. 7(d)) so that a temperature of the resin composition 26 rises. As a result, the viscosity of the resin composition 26 becomes lower, and the convection additive (sodium hydrogen carbonate) is decomposed to generate a gas 28. The generated gas 28 provides a convection effect (as indicated as an arrow in FIG. 7(d)) in the resin composition 26 until the gas 28 escapes to the outside. This convection effect makes it possible to promote the movement of the metal powder 24, and thereby the solder powder 24 is allowed to convect and self-assemble toward the electrodes 22 due to wettability of the electrodes. While the solder powder 24 is convecting and self-assembling, the melting of the solder powder 24 is performed. The movement of the solder powder 24 is suppressed by the existence of the electrically-conductive particles 23 fixed on the electrodes 22. That is to say, the solder powder 24 is captured by the electrically-conductive particles 23 having high wettability to the solder. This results in a fusion bond between the solder powder 24 and the particles 23, which leads to a growth of the molten solder 24b to form bumps.

As a result, as shown in FIG. 7(e), each molten solder 4b grows until the upper surface thereof reaches each land 24 of the cover 41, so that bump bodies are formed. Subsequently, the cover 41 and the release agent layer 43 is removed whereas the lands 42 are left to remain on the bump bodies. It is preferred in this case that the removal of the cover 41 and the release agent layer 43 is performed under such a condition that each molten solder 24b has been not yet solidified and that the resin component 25 has been already cured.

Finally, by solidifying each molten solder 24b, bumps 45 that respectively have projecting portions 44 are obtained, as shown in FIG. 7(f). The bumps 45 are thicker than the resin layer 29. The projecting portions 44 of the bumps 45 have uniform height and have spherical surfaces.

In a case where the bumps 45 are subsequently used for a flip chip mounting process using a semiconductor chip, the resin layer 29 can serve as a "member for regulating an connecting distance", which will lead to an achievement of a satisfactory flip chip mounting process in terms of an excellent connecting reliability.

In order to obtain the bumps 45 that are thicker than the resin layer 29, the resin component 25 is preferably selected so as to occur a large volume shrinkage thereof during the curing process thereof.

Turning now to FIG. 8, a process for forming bumps by means of a cover 51 having release properties shown in FIG. 6(c) will be described.

FIG. 8 shows a bump-forming process using the cover 51 wherein FIGS. 8(a) and 8(b) respectively correspond to FIGS. 7(e) and 7(f), and the other steps of FIG. 8 are similar to those of FIG. 7.

Firstly, the embodiment as shown in FIG. 8(a) is obtained wherein each of the grown molten solders 24b is in contact with each land 52 of the cover 51. This embodiment is similar to that of FIG. 7(e). As shown in FIG. 8(a), the grown molten solders 24b are projected from a surface of the resin layer 29 since the release agent layer 53 formed on the cover 51 is thicker than the lands 52 formed on the cover 51.

Finally, by removing the cover 51 and the release agent layer 53, followed by solidifying the molten solders 24b, bumps 55 that respectively have projecting portions 54 are obtained as shown in FIG. 8(b) wherein the bumps 55 are thicker than the resin layer 29, and the projecting portions 54 of the bumps 45 have uniform height and spherical surfaces. In this way, it is possible to freely determine a height of the bumps 55 by changing a thickness of the release agent layer 53. Also, the bumps 55 thicker than the resin layer 29 can be obtained irrespective of the volume shrinkage of the resin component upon the curing process, which will lead to a wider application.

The present invention has been hereinabove described with reference to some embodiments. It will be understood that a bump package wherein a uniformity of the bumps and satisfactory electrical insulating properties between the neighboring bumps are achieved can be obtained by performance of the process for forming bumps according to any one of the third to the fifth embodiments. Furthermore, it will be understood that the present invention is not limited to the above-mentioned embodiments and can be modified in various ways.

For example, instead of applying or printing the paste resin composition onto the electronic component (see any one of the third to the fifth embodiments), a prepreg resin sheet in which the resin component contained in the resin composition has been already semi-cured may be used. In this case, the prepreg resin sheet may be interposed between the electronic component and the cover having release properties.

The present invention as described above includes the following aspects:

The first aspect: A flip chip mounting process for electrically interconnecting a first electronic component and a second electronic component, the process comprising the steps of:

(i) preparing a first electronic component on which a plurality of electrodes (a) are formed and a second electronic component on which a plurality of electrodes (b) are formed;

(ii) disposing electrically-conductive particles on said electrodes (a) and/or said electrodes (b);

(iii) supplying a composition comprising solder powder, a convection additive and a resin component onto said second electronic component;

(iv) bringing said first electronic component into contact with the supplied composition such that said electrodes (a) of said first electronic component are opposed to said electrodes (b) of said second electronic component; and (v) heating said supplied composition, and thereby connections which electrically interconnect said electrodes (a) and said electrodes (b) are formed from said electrically-conductive particles and said solder powder.

The second aspect: The flip chip mounting process according to the first aspect, wherein
in said step (v), said resin component is cured to form a resin layer which bonds between said first electronic component and said second electronic component.

The third aspect: The flip chip mounting process according to the first or the second aspect, wherein
said first electronic component prepared in the step (i) is a semiconductor chip, and
said second electronic component prepared in the step (i) is a circuit substrate.

The fourth aspect: The flip chip mounting process according to any one of the first to the third aspects, wherein said electrically-conductive particles disposed in the step (ii) are at least one kind of particles selected from the group consisting of metal particles, solder particles, plated metal particles and plated resin particles.

The fifth aspect: The flip chip mounting process according to any one of the first to the fourth aspects, wherein said composition supplied in the step (iii) is in paste form or in sheet form.

The sixth aspect: The flip chip mounting process according to any one of the first to the fifth aspects, wherein, with regard to the said convection additive that is contained in said composition supplied in the step (iii),
a boiling point of said convection additive is between a curing reaction-initiating temperature of said resin component and a peak temperature of the curing reaction of said resin component, or
said convection additive is decomposed to generate a gas under a temperature condition between a curing reaction-initiating temperature of said resin component and a peak temperature of the curing reaction of said resin component.

The seventh aspect: The flip chip mounting process according to any one of the first to the sixth aspects, wherein said convection additive that is contained in said composition supplied in the step (iii) is at least one material selected from the group consisting of xylene, isobutyl alcohol, isopentyl alcohol, butyl acetate, tetrachlorethylene, methyl isobutyl ketone, ethyl carbitol, butyl carbitol, ethylene glycol, aluminum hydroxide, dawsonite, ammonium metaborate, barium metaborate and sodium hydrogen carbonate.

The eighth aspect: The flip chip mounting process according to any one of the first to the seventh aspects, wherein said resin component that is contained in said composition supplied in the step (iii) is at least one resin selected from the group consisting of epoxy resin, unsaturated polyester resin, alkyd resin, polybutadiene resin, polyimide resin, polyamide resin and cyanate resin.

The ninth aspect: A flip chip assembly obtained by performance of the flip chip mounting process according to any one of the first to the eighth aspects, wherein a plurality of electrodes (a) formed on a first electronic component are electrically connected to a plurality of electrodes (b) formed on a second electronic component.

The tenth aspect: The flip chip assembly according to the ninth aspect, wherein
said first electronic component is a semiconductor chip, and
said second electronic component is a circuit substrate.

The eleventh aspect: A process for forming bumps on a plurality of electrodes of an electronic component, the process comprising the steps of:
(i) preparing an electronic component on which a plurality of electrodes are formed, and also preparing a cover having release properties;
(ii) disposing electrically-conductive particles on said electrodes of said electronic component;
(iii) supplying a composition comprising solder powder, convection additive and a resin component onto a surface (A) of said electronic component, such surface (A) being provided with said electrodes;
(iv) bringing said cover into contact with the supplied composition;
(v) heating said supplied composition, and thereby bumps are formed on said electrodes from said electrically-conductive particles and said solder powder, and also a resin layer is formed between said electronic component and said cover from said resin component; and
(vi) removing said cover.

The twelfth aspect: The process according to the eleventh aspect, wherein in the step (vi), not only said cover is removed, but also said resin layer is removed.

The thirteenth aspect: The process according to the eleventh or the twelfth aspect, wherein said cover prepared in the step (i) is the following plate:
a plate that is made of at least one resin selected from the group consisting of silicone resin, fluorine resin and polypropylene resin; or
a plate that is coated with at least one material selected from the group consisting of silicone oil, inorganic oxide, inorganic nitride and inorganic nitrided oxide.

The fourteenth aspect: The process according to any one of the eleventh to the thirteenth aspects, wherein
between the step (i) and step (ii), a release agent layer is formed on said surface (A) of said electronic component except for a surface region provided with said electrodes; and
in the step (vi), not only said cover is removed, but also said resin layer and said release agent layer are removed.

The fifteenth aspect: The process according to any one of the eleventh to the thirteenth aspects,
a plurality of lands are formed on a surface (B) of said cover prepared in the step (i) so that a land pattern of said cover corresponds to that of said electrodes of said electronic component, and also a release agent layer is formed on said surface (B) of said cover except for a surface region provided with said lands;
in the step (iv), said cover is brought into contact with the supplied composition such that said lands of said cover are opposed to said electrodes of said electronic component;
in the step (v), bumps which interconnect said lands and said electrodes are formed from said electrically-conductive particles and said solder powder; and
in the step (vi), said cover and said release agent layer are removed whereas said lands are left to remain on said bumps.

The sixteenth aspect: The process according to the fifteenth aspect, wherein said release agent layer formed on said cover is thicker than said lands formed on said cover.

The seventeenth aspect: The process according to any one of eleventh to the sixteenth aspects, wherein said composition supplied in the step (iii) is in paste form or in sheet form.

The eighteenth aspect: The process according to any one of the eleventh to the seventeenth aspects, wherein said resin component that is contained in said composition supplied in the step (iii) is at least one resin selected from the group consisting of epoxy resin, unsaturated polyester resin, alkyd resin, polybutadiene resin, polyimide resin, polyamide resin and cyanate resin.

The nineteenth aspect: The process according to any one of the eleventh to the eighteenth aspects, wherein said electronic component prepared in the step (i) is a semiconductor chip or a circuit substrate.

The twentieth aspect: A bump package obtained by performance of the process according to any one of the eleventh to the nineteenth aspects, wherein bumps are formed on a plurality of electrodes formed on an electronic component.

INDUSTRIAL APPLICABILITY

According to a flip chip mounting process of the present invention, the melted solder that has self-assembled toward a region between the opposed electrodes can be efficiently captured by the electrically-conductive particles fixed on the electrodes, and thereby the molten solder can efficiently grow between the opposed electrodes. Therefore, the flip chip mounting process of the present invention is particularly beneficial for a mounting process field using a circuit substrate, a semiconductor chip and the like.

CROSS REFERENCE TO RELATED PATENT APPLICATION

The present application claims the right of priority of Japanese Patent Application No. 2005-074595 (filed on Mar. 16, 2005, the title of the invention: "FLIP CHIP ASSEMBLY, FLIP CHIP MOUNTING PROCESS AND BUMP-FORMING PROCESS"), the disclosure of which is incorporated herein by reference.

The invention claimed is:
1. A process for forming bumps on a plurality of electrodes of an electronic component, the process comprising the steps of:
(i) preparing an electronic component on which a plurality of electrodes are formed, and also a cover having release properties;
(ii) disposing electrically-conductive particles on said electrodes of said electronic component;
(iii) supplying a composition comprising solder powder, convection additive and a resin component onto a surface (A) of said electronic component, which is provided with the electrodes;
wherein the composition is supplied directly onto said electrically-conductive particles and directly onto a surface of the electronic component between electrodes;
(iv) bringing said cover into contact with the supplied composition;
(v) heating said supplied composition, and thereby solder bumps are formed on said electrodes from said electrically-conductive particles and said solder powder, and also a resin layer is formed between said electronic component and said cover from said resin component;
wherein the solder bumps formed on the electrodes are formed through melting the solder powder included in the resin composition by heating the composition to allow the melted solder powder to self-assemble by growing the melted solder powder up to a level of a surface of said cover;

wherein the electrically-conductive particles, which have a melting point higher than that of the solder powder, serve as nuclei for capturing the melted solder powder; and (vi) removing said cover.

2. The process according to claim 1, wherein in the step (vi), not only said cover is removed, but also said resin layer is removed.

3. The process according to claim 1, wherein said cover prepared in the step (i) is the following plate:

a plate that is made of at least one resin selected from the group consisting of silicone resin, fluorine resin and polypropylene resin; or a plate that is coated with at least one material selected from the group consisting of silicone oil, inorganic oxide, inorganic nitride and inorganic nitrided oxide.

4. The process according to claim 1, wherein between the step (i) and step (ii), a release agent layer is formed on said surface (A) of said electronic component except for a surface region provided with said electrodes; and in the step (vi), not only said cover is removed, but also said resin layer and said release agent layer are removed.

5. The process according to claim 1, wherein, a plurality of lands are formed on a surface (B) of said cover prepared in the step (i) so that a land pattern of said cover corresponds to that of said electrodes of said electronic component, and also a release agent layer is formed on said surface (B) of said cover except for a surface region provided with said lands;

in the step (iv), said cover is brought into contact with the supplied composition such that said lands of said cover are opposed to said electrodes of said electronic component;

in the step (v), bumps which interconnect said lands and said electrodes are formed from said electrically-conductive particles and said solder powder; and in the step (vi), said cover and said release agent layer are removed whereas said lands are left to remain on said bumps.

6. The process according to claim 5, wherein said release agent layer formed on said cover is thicker than said lands formed on said cover.

7. The process according to claim 1, wherein said composition supplied in the step (iii) is in paste form or in sheet form.

8. The process according to claim 1, wherein said resin component that is contained in said composition supplied in the step (iii) is at least one resin selected from the group consisting of epoxy resin, unsaturated polyester resin, alkyd resin, polybutadiene resin, polyimide resin, polyamide resin and cyanate resin.

9. The process according to claim 1, wherein said electronic component prepared in the step (i) is a semiconductor chip or a circuit substrate.

* * * * *